(12) United States Patent
Lin

(10) Patent No.: US 8,471,634 B2
(45) Date of Patent: Jun. 25, 2013

(54) METHOD AND APPARATUS OF COMMON MODE COMPENSATION FOR VOLTAGE CONTROLLED DELAY CIRCUITS

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 23 days.

(21) Appl. No.: 13/281,573

(22) Filed: Oct. 26, 2011

(65) Prior Publication Data

US 2013/0106515 A1    May 2, 2013

(51) Int. Cl.
 *H03F 3/45* (2006.01)
(52) U.S. Cl.
 USPC .......................................... 330/258; 330/257
(58) Field of Classification Search
 USPC ................... 330/253, 257, 258, 261
 See application file for complete search history.

(56) References Cited

U.S. PATENT DOCUMENTS

| | | | | |
|---|---|---|---|---|
| 6,356,152 | B1 * | 3/2002 | Jezdic et al. | 330/258 |
| 6,664,814 | B1 * | 12/2003 | Evans et al. | 330/258 |
| 8,310,308 | B1 * | 11/2012 | Ginsburg et al. | 330/258 |

* cited by examiner

*Primary Examiner* — Khanh V Nguyen
(74) *Attorney, Agent, or Firm* — McClure, Qualey & Rodack, LLP

(57) ABSTRACT

An apparatus of common mode compensation for voltage controlled delay circuits and method are provided. In one implementation a method includes amplifying a differential input signal to generate a differential output signal using a differential pair of transistors biased by a tail current; changing the tail current by a first amount to change a circuit delay of the differential pair of transistors; generating a first compensation current and a second compensation current by using a current mirroring such that a sum of the first compensation current and the second compensation current is of a second amount that is substantially equal to the first amount; injecting the first compensation current into the first end of the differential output signal via a first coupling resistor; and injecting the second compensation current into the second end of the differential output signal via a second coupling resistor.

16 Claims, 3 Drawing Sheets

METHOD AND APPARATUS OF COMMON MODE COMPENSATION FOR VOLTAGE CONTROLLED DELAY CIRCUITS

FIELD OF TECHNOLOGY

This disclosure relates generally to method and apparatus of voltage controlled delay circuits.

BACKGROUND

Voltage controlled delay circuits (VCDC) are widely used in numerous applications such as ring oscillators, delay lock loops, and so on. A particular application of interest is a voltage controlled ring oscillator having a plurality of stages of VCDC configured in a ring topology, wherein each one of said stages of VCDC receives an input from a preceding stage and outputs an output to a succeeding stage, and a circuit delay from the input to the output is controlled by a control voltage. FIG. 1 depicts a 3-stage voltage controlled ring oscillator 100 comprising three VCDC 110, 120, and 130; each VCDC, configured in a differential circuit topology, has a first (or positive) input terminal $V_{i+}$, a second (or negative) input terminal $V_{i-}$, a first (or positive) output terminal $V_{o+}$, a second (or negative) output terminal $V_{o-}$, and a control terminal VC; an input is defined as a voltage difference between the two input terminals $V_+$ and $V_{i-}$; an output is defined as a voltage difference between the two output terminals $V_{o+}$ and $V_{o-}$; and a circuit delay from the input to the output is controlled by a control voltage applied at the control terminal VC. A control voltage VCTL is applied to all three VCDC 110-130; the control voltage VCTL determines the circuit delay of the three VCDC, and therefore determines an oscillation frequency of the ring oscillator.

There are many circuits suitable for embodying voltage controlled delay circuits. A circuit of particular interest is a CML (current-mode logic) amplifier 200 shown in FIG. 2. CML amplifier 200 comprises: a current source 210 comprising an NMOS (n-type metal-oxide semiconductor) transistor 211, a differential pair 220 comprising NMOS transistors 221 and 222, and a load 230 comprising resistors 231 and 232. Here, $V_{DD}$ is a power supply node. CML amplifier 200 is well known in prior art and self-explanatory to those of ordinary skills in the art, therefore no detailed explanation is given here. A higher voltage at the VC terminal leads to a larger bias current $I_b$, resulting in a shorter circuit delay of the delay circuit, and consequently a higher oscillation frequency of the ring oscillator. There is a drawback in CML amplifier 200, however, that a common mode voltage of the output depends on the bias current $I_b$; therefore, when the control voltage changes, the common mode voltage of the output also changes. In many applications, it is highly desirable that the common mode voltage remains substantially the same in spite of a change in the control voltage.

What is desired is a voltage controlled delay circuit that has an output of a substantially fixed common mode voltage when the control voltage changes.

SUMMARY

In an embodiment, an apparatus comprises: a first current source comprising a first NMOS (n-type metal oxide semiconductor) transistor for receiving a first bias voltage and outputting a first current; a second current source comprising a second NMOS transistor for receiving a control voltage and outputting a second current; a differential pair comprising a third NMOS transistor and a fourth NMOS transistor biased by a tail current comprising a combination of the first current and the second current for receiving a differential input signal comprising a positive end and a negative end and outputting a differential output signal comprising a positive end and a negative end; a load circuit comprising a pair of pull-up resistors for coupling the differential output signal of the differential pair to a first power supply voltage; a current mirror powered from a second power supply voltage for receiving the control voltage and outputting a third current and a fourth current; and a pair of coupling resistors for coupling the third current and the fourth current to the negative end and the positive end of the differential output signal. A resistance of said pair of coupling resistors is substantially higher than a resistance of the load circuit. The second power supply voltage is higher than the first power supply voltage. A sum of the third current and the fourth current is approximately equal to the second current in magnitude.

In another embodiment a method comprises: generating a first current using a first current source comprising a first NMOS (n-type metal oxide semiconductor) transistor in accordance with a first bias voltage; generating a second current using a second current source comprising a second NMOS transistor in accordance with a control voltage; receiving a differential input signal comprising a positive end and a negative end; amplifying the differential input signal using a differential pair comprising a third NMOS transistor and a fourth NMOS transistor biased by a tail current comprising a combination of the first current and the second current to generate a differential output signal comprising a positive end and a negative end; coupling the differential output signal to a first power supply voltage via a load circuit comprising a pair of pull-up resistors; generating a third current and a fourth current using a current mirror powered from a second power supply voltage in accordance with the control voltage; and coupling the third current and the fourth current to the differential output signal via a pair of coupling resistors. A resistance of said pair of coupling resistors is substantially higher than a resistance of the load circuit. The second power supply voltage is higher than the first power supply voltage. A sum of the third current and the fourth current is approximately equal to the second current in magnitude.

In one embodiment, a method comprises: amplifying a differential input signal to generate a differential output signal comprising a first end and a second end using a differential pair of transistors biased by a tail current; changing the tail current by a first amount to change a circuit delay of the differential pair; generating a first compensation current and a second compensation current using current mirroring; injecting the first compensation current into the first end of the differential output signal via a first coupling resistor; and injecting the second compensation current into the second end of the differential output signal via the second coupling resistor, wherein a sum of the first compensation current and the second compensation current is of a second mount that is substantially equal to the first amount.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1:
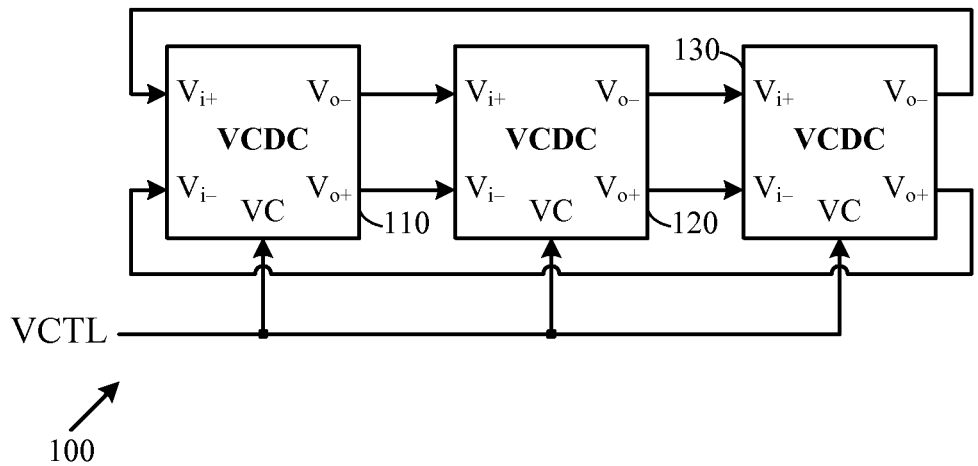
FIG. 1 shows a schematic diagram of a prior art voltage controlled ring oscillator.
Figure 2:
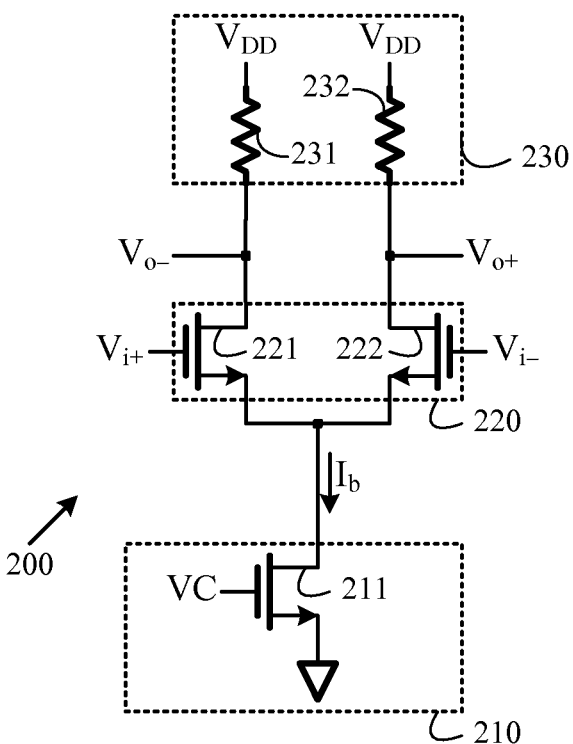
FIG. 2 shows a schematic diagram of a CML (current-mode logic) amplifier.
Figure 3A:
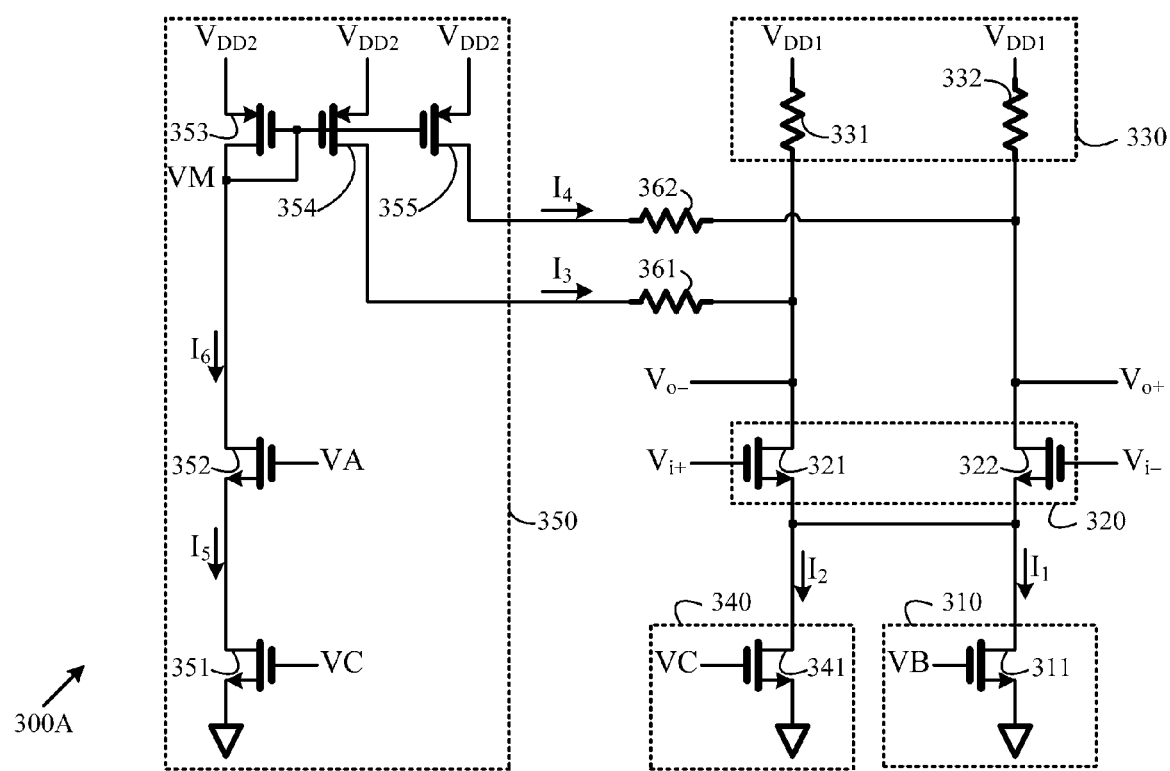
FIG. 3A shows a voltage controlled delay circuit in accordance with an embodiment of the present invention.

A voltage controlled delay circuit (VCDC) 300A in accordance with an embodiment of this present invention is depicted in FIG. 3. VCDC 300A comprises: a first current source 310 comprising a first NMOS (n-type metal oxide semiconductor) transistor 311 for receiving a first bias voltage VB and outputting a first current $I_i$; a second current source 340 comprising a second NMOS transistor 341 for receiving a control voltage VC and outputting a second current $I_2$; a differential pair 320 comprising a third NMOS 321 and a fourth NMOS transistor 322 biased by a tail current comprising a combination of the first current $I_1$ and the second current $I_2$ for receiving a differential input signal comprising a positive end $V_{i+}$ and a negative end $V_{i-}$ and outputting a differential output signal comprising a positive end $V_{o+}$ and a negative end $V_{o-}$; a load circuit 330 comprising a pair of pull-up resistors 321 and 322 for coupling the output of the differential pair 320 to a first power supply voltage $V_{DD1}$; a current mirror 350 powered from a second power supply voltage $V_{DD2}$ for receiving the control voltage VC and outputting a third current $I_3$ and a fourth current $I_4$; and a pair of coupling resistors 361 and 362 for coupling the third current $I_3$ and the fourth current $I_4$ to the negative end $V_{o-}$ and the positive end $V_{o+}$ of the output of the differential pair 320, respectively. The current mirror 350 comprises: a fifth NMOS transistor 351 for receiving the control voltage VC and outputting a fifth current $I_5$; a sixth NMOS transistor 352 configured in a cascode topology with a gate terminal coupled to a second bias voltage VA for receiving the fifth current $I_5$ and outputting a sixth current $I_6$; a first PMOS (p-type metal oxide semiconductor field effect transistor) 353 configured in a diode-connected topology for receiving the sixth current $I_6$ and establishing a mirrored control voltage VM; a second PMOS 354 for outputting the third current $I_3$ in accordance with the mirrored control voltage VM; and a third PMOS 355 for outputting the fourth current $I_4$ in accordance with the mirrored control voltage VM. A principle of VCDC 300 is explained as follows.

If one removes the second current source 340, the current mirror 350, and the coupling resistor pair 361-362, VCDC 300A would have included merely the first current source 310, the differential pair 320, and the load circuit 330, and VCDC 300A would have degenerated into a CML (common-mode logic) amplifier well known in prior art; in this case, the common mode voltage of the output signal $V_o$ is approximately equal to $V_{DD1}-I_1 \cdot R/2$ (here, R is a resistance of resistor 331, which has the same resistance as resistor 332). By providing extra current $I_2$ to the differential pair 320 using the second current source 340 controlled by the control voltage VC, one speeds up the differential pair 320 and thus shortens the circuit delay in accordance with the control voltage VC. In the mean while, the current mirror 350 is used to inject the third current $I_3$ and the fourth current $I_4$ to the two output ends $V_{O-}$ and $V_{O+}$ of the differential pair 320 in a manner such that $I_3$ and $I_4$ are both approximately equal to $I_2/2$; the extra current provided to the differential pair 320, therefore, is approximately compensated by the third current $I_3$ and the fourth current $I_4$, and the common mode voltage of the output signal $V_O$ remains approximately equal to $V_{DD1}-I_1 \cdot R/2$, despite the extra current $I_2$ to the differential pair 320 and the resultant reduction of circuit delay. Current mirror 350 is embodied so as to ensure $I_3$ and $I_4$ are both approximately equal to $I_2/2$. A principle of current mirror 350 is explained as follows.

Under a given gate-to-source voltage, an output current at a drain terminal of a NMOS transistor is approximately proportional to a width-to-length ratio, hereafter W/L ratio, of the NMOS transistor. Let the W/L ratios of NMOS transistors 341 and 351 be $a_1$ and $a_2$, respectively, and the W/L ratios of PMOS transistors 353, 354, and 355 be $a_3$, $a_4$, and $a_5$, respectively. Since NMOS transistors 341 and 351 have the same gate-to-source voltage VC, $I_2$ and $I_5$ are approximately proportional to $a_1$ and $a_2$, respectively. Therefore, one obtains the following relation:

$$I_5 \approx I_2 \cdot (a_2/a_1)$$

NMOS transistor 352 is a cascode device used to alleviate a channel length modulation of NMOS transistor 351; $I_6$ is approximately equal to $I_5$, therefore one obtains the following relation:

$$I_6 \approx I_2 \cdot (a_2/a_1)$$

Since PMOS transistors 353, 354, and 355 have a common gate-to-source voltage $VM-V_{DD2}$, $I_6$, $I_3$, and $I_4$ are approximately proportional to $a_3$, $a_4$, and $a_5$, respectively. Therefore, one obtains the following relations:

$$I_3 \approx I_2 \cdot (a_2/a_1) \cdot (a_4/a_3)$$

$$I_4 \approx I_2 \cdot (a_2/a_1) \cdot (a_5/a_3)$$

Therefore, one can make $I_3$ and $I_4$ approximately equal to $I_2/2$ as long as one chooses $a_1$, $a_2$, $a_3$, $a_4$, and $a_5$ that satisfies the following relations:

$$(a_2/a_1) \cdot (a_4/a_3) = \tfrac{1}{2} \quad (5)$$

$$(a_2/a_1) \cdot (a_5/a_3) = \tfrac{1}{2} \quad (6)$$

Coupling resistors 361 and 362 are employed so as to alleviate loading of the current mirror 350 to the differential pair 320. A resistance of resistors 361 and 362 must be substantially higher than a resistance of resistors 331 and 332, so that resistors 331 and 332 dominate over resistors 361 and 362, as far as a loading effect to differential pair 320 is concerned. Resistor 361 (362), however, introduces a voltage drop that is proportional to a magnitude of $I_3$ ($I_4$). Current mirror 350 must be able to support a voltage that is higher than the target output common mode voltage plus the voltage drop. For this reason, current mirror 350 is powered from the second power supply voltage $V_{DD2}$ that is higher than the first power supply voltage $V_{DD1}$.

Figure 3B:
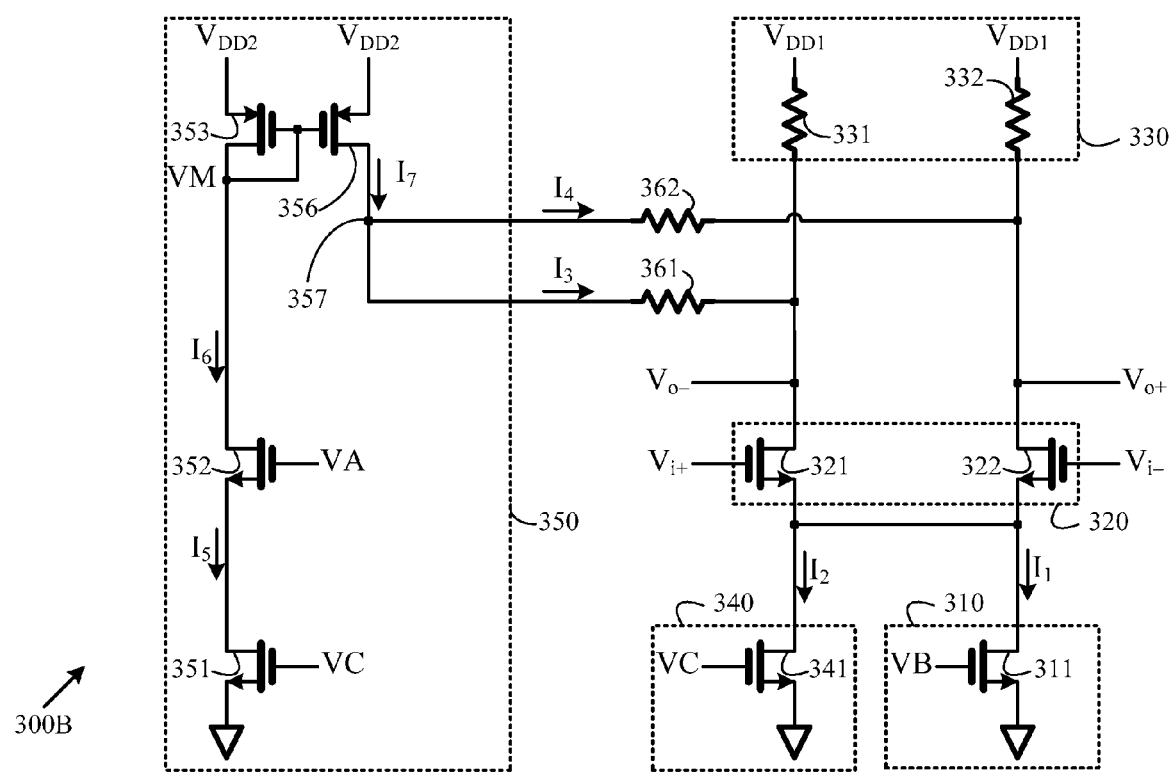
FIG. 3B shows a voltage controlled delay circuit in accordance with an alternative embodiment of the present invention.

An alternative embodiment 300B is shown in FIG. 3B. Embodiment 300B is similar to the embodiment 300A of FIG. 3A, except that: PMOS 354 and PMOS 355 are replaced by PMOS 356 for outputting a seventh current $I_7$ to circuit node 357, wherein the seventh $I_7$ splits into the third current $I_3$ and the fourth current $I_4$ from circuit node 357. In this alternative embodiment, the W/L ratio of PMOS 356 is approximately equal to a sum of the W/L ratio of PMOS 354 and the W/L ratio of PMOS 355 of FIG. 3A, so that $I_7$ is approximately equal to $I_2$ in magnitude. Note that embodiment 300A is functionally equivalent to embodiment 300B if one ties the drain terminal of PMOS 354 to the drain terminal of PMOS 355.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. A apparatus comprising:
   a first current source for receiving a first bias voltage and outputting a first current;
   a second current source for receiving a control voltage and outputting a second current;
   a differential pair biased by a tail current comprising a combination of the first current and the second current for receiving a differential input signal comprising a positive end and a negative end and outputting a differential output signal comprising a positive end and a negative end;
   a load circuit for coupling the differential output signal of the differential pair to a first power supply voltage;
   a current mirror powered from a second power supply voltage for receiving the control voltage and outputting a third current and a fourth current; and
   a pair of coupling resistors for coupling the third current and the fourth current to the negative end and the positive end of the differential output signal.

2. The apparatus of claim 1, wherein the second power supply voltage is higher than the first power supply voltage.

3. The apparatus of claim 1, wherein a resistance of said pair of coupling resistors is substantially higher than a resistance of the load circuit.

4. The apparatus of claim 1, wherein the current mirror comprises:
   a third current source for outputting a fifth current in accordance with the control voltage;
   a first transistor configured in a cascode topology for receiving the fifth current and outputting a sixth current;
   a second transistor configured in a diode-connected topology for receiving the sixth current and establishing a mirrored control voltage;
   a third transistor for outputting the third current in accordance with the mirrored control voltage; and
   a fourth transistor for outputting the fourth current in accordance with the mirrored control voltage.

5. The apparatus of claim 4, wherein a drain terminal of the third transistor is tied to a drain terminal of the fourth transistor.

6. The apparatus of claim 1, wherein a sum of the third current and the fourth current is approximately equal to the second current in magnitude.

7. The apparatus of claim 1, wherein the load circuit comprises a pair of pull-up resistors.

8. A method comprising:
   generating a first current using a first current source in accordance with a first bias voltage;
   generating a second current using a second current source accordance with a control voltage;
   amplifying a differential input signal using a differential pair biased by a tail current comprising a combination of the first current and the second current to generate a differential output signal;
   coupling the differential output signal to a first power supply voltage via a load circuit;
   generating a third current and a fourth current using a current mirror powered from a second power supply voltage in accordance with the control voltage; and
   coupling the third current and the fourth current to the differential output signal via a pair of coupling resistors.

9. The method of claim 8, wherein the second power supply voltage is higher than the first power supply voltage.

10. The method of claim 8, wherein a resistance of said pair of coupling resistors is substantially higher than a resistance of the load circuit.

11. The method of claim 8, wherein the current mirror comprises:
    a third current source comprising a first NMOS (n-type metal-oxide semiconductor) transistor for outputting a fifth current in accordance with the control voltage;
    a second NMOS transistor configured in a cascode topology for receiving the fifth current and outputting a sixth current;
    a first PMOS (p-type metal oxide semiconductor) transistor configured in a diode-connected topology for receiving the sixth current and establishing a mirrored control voltage;
    a second PMOS transistor for outputting the third current in accordance with the mirrored control voltage; and
    a third PMOS transistor for outputting the fourth current in accordance with the mirrored control voltage.

12. The method of claim 11 further comprising: tying a drain terminal of the second PMOS transistor to a drain terminal of the third PMOS transistor.

13. The method of claim 8, wherein a sum of the third current and the fourth current is approximately equal to the second current in magnitude.

14. A method comprising:
    amplifying a differential input signal to generate a differential output signal using a differential pair of transistors biased by a tail current;
    changing the tail current by a first amount to change a circuit delay of the differential pair of transistors;
    generating a first compensation current and a second compensation current by using a current mirroring such that a sum of the first compensation current and the second compensation current is of a second amount that is substantially equal to the first amount;
    injecting the first compensation current into the first end of the differential output signal via a first coupling resistor; and
    injecting the second compensation current into the second end of the differential output signal via a second coupling resistor.

15. The method of claim 14 further comprising: using a supply voltage sufficiently high for both a first current mirroring and a second current mirroring such that a voltage drop across either the first coupling resistor or the second coupling resistor does not hinder the injecting of either the first or the second compensation current.

16. The method of claim 14, wherein a resistance of the first coupling resistor is sufficiently high so that injecting the first compensation current into the first end of the differential output signal via the first coupling resistor does not substantially slow down a circuit speed of a differential pair of transistors, and a resistance of the second coupling resistor is sufficiently high so that injecting the second compensation current into the second end of the differential output signal via the second coupling resistor does not substantially slow down the circuit speed of the differential pair.

* * * * *